(12) United States Patent
Rice

(10) Patent No.: US 10,720,348 B2
(45) Date of Patent: Jul. 21, 2020

(54) DUAL LOAD LOCK CHAMBER

(71) Applicant: APPLIED MATERIALS, INC., Santa Clara, CA (US)

(72) Inventor: Michael R. Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 12 days.

(21) Appl. No.: 15/983,683

(22) Filed: May 18, 2018

(65) Prior Publication Data

US 2019/0355600 A1    Nov. 21, 2019

(51) Int. Cl.
  *H01L 21/67*     (2006.01)
  *H01L 21/687*    (2006.01)
  *B25J 15/06*     (2006.01)

(52) U.S. Cl.
  CPC .... *H01L 21/67201* (2013.01); *B25J 15/0616* (2013.01); *H01L 21/67103* (2013.01); *H01L 21/68707* (2013.01); *Y10S 901/36* (2013.01)

(58) Field of Classification Search
  CPC ......... H01L 21/67201; H01L 21/67103; H01L 21/68707
  See application file for complete search history.

(56) References Cited

U.S. PATENT DOCUMENTS

| | | | | |
|---|---|---|---|---|
| 6,059,507 A | * | 5/2000 | Adams | ................ G03F 7/7075 414/217 |
| 6,186,722 B1 | * | 2/2001 | Shirai | ............... H01L 21/67167 414/217 |
| 6,486,444 B1 | | 11/2002 | Fairbairn et al. | |
| 6,528,767 B2 | | 3/2003 | Bagley et al. | |
| 6,530,732 B1 | * | 3/2003 | Theriault | ............ H01L 21/6719 118/719 |
| 7,019,263 B2 | * | 3/2006 | Ishihara | .............. F27B 17/0025 118/50.1 |
| 7,207,766 B2 | | 4/2007 | Kurita et al. | |

(Continued)

FOREIGN PATENT DOCUMENTS

| | | |
|---|---|---|
| EP | 0290501 B1 | 3/1993 |
| KR | 10-2015-0025242 A | 3/2015 |
| WO | WO 2013/073888 A1 | 5/2013 |

OTHER PUBLICATIONS

International Search Report for PCT/US2019/031257, dated Aug. 14, 2019.

*Primary Examiner* — Kaitlin S Joerger
(74) *Attorney, Agent, or Firm* — Moser Taboada; Alan Taboada

(57) ABSTRACT

Dual load lock chambers for use in a multi-chamber processing system are disclosed herein. In some embodiments, a dual load lock chamber, includes a first load lock chamber having a first interior volume and a first substrate support, wherein the first substrate support includes a first plurality of support surfaces vertically spaced apart by a first predetermined distance; at least one heat transfer device disposed within the first substrate support to heat or cool the first plurality of substrates; and a second load lock chamber disposed adjacent to the first load lock chamber and having a second interior volume and a second substrate support, wherein the second substrate support includes a second plurality of support surfaces vertically spaced apart by a second predetermined distance that less than the first predetermined distance.

20 Claims, 5 Drawing Sheets

(56) References Cited

U.S. PATENT DOCUMENTS

| | | |
|---|---|---|
| 7,316,966 B2 | 1/2008 | Kurita et al. |
| 7,655,571 B2 * | 2/2010 | Kawaguchi ........ H01L 21/02057 |
| | | 438/706 |
| 7,665,951 B2 * | 2/2010 | Kurita ................... C23C 14/566 |
| | | 414/217 |
| 8,061,949 B2 * | 11/2011 | Kurita ................... C23C 14/566 |
| | | 414/217 |
| 8,272,825 B2 | 9/2012 | Hofmeister et al. |
| 8,616,820 B2 | 12/2013 | Kurita et al. |
| 8,662,812 B2 * | 3/2014 | Hofmeister ........ H01L 21/67126 |
| | | 414/217 |
| 9,263,307 B2 * | 2/2016 | Kim .................. H01L 21/67201 |
| 9,285,168 B2 * | 3/2016 | Lubomirsky .......... F26B 25/004 |
| 9,337,014 B1 * | 5/2016 | Galburt .............. H01L 21/67201 |
| 9,355,876 B2 * | 5/2016 | Reuter ................ H01L 21/6719 |
| 9,735,002 B2 * | 8/2017 | Kawaguchi ........ H01L 21/02057 |
| 2006/0245852 A1 * | 11/2006 | Iwabuchi .......... H01L 21/67201 |
| | | 414/217 |
| 2007/0006936 A1 | 1/2007 | Hosokawa et al. |
| 2007/0140814 A1 | 6/2007 | Kurita et al. |
| 2009/0029502 A1 | 1/2009 | Choi et al. |
| 2009/0320948 A1 | 12/2009 | Asanuma et al. |
| 2010/0326637 A1 * | 12/2010 | Sasaki ................ H01L 21/67109 |
| | | 165/138 |
| 2011/0304078 A1 * | 12/2011 | Lee .................... H01L 21/67201 |
| | | 264/344 |
| 2013/0337655 A1 | 12/2013 | Lee et al. |
| 2015/0340257 A1 * | 11/2015 | Brillhart ........... H01L 21/67201 |
| | | 392/416 |
| 2016/0284577 A1 * | 9/2016 | Ishizawa ........... H01L 21/67745 |
| 2016/0314997 A1 * | 10/2016 | Reuter ............. H01L 21/67201 |
| 2018/0226280 A9 * | 8/2018 | Hofmeister ....... H01L 21/67017 |
| 2019/0122870 A1 * | 4/2019 | Ishizawa ........... H01L 21/67109 |

\* cited by examiner

DUAL LOAD LOCK CHAMBER

FIELD

Embodiments of the present disclosure generally relate to substrate processing systems, and more specifically to methods and apparatus for multi-chamber processing systems.

BACKGROUND

Processing systems, for example, such as a cluster tool having multiple process chambers coupled to a shared transfer chamber are utilized to reduce system and manufacturing costs and improve process throughput. One or more load lock chambers facilitate passage of substrates to/from a factory interface and the shared transfer chamber.

However, conventional load lock chambers can reduce throughput in cluster tools multi-chamber systems at each station (e.g., dual or quad chambers). In such a system, the load lock may act as a bottleneck because a transfer robot in the shared transfer chamber may need to make numerous trips between the load lock chamber and each multi-chamber system to facilitate transfer of substrates to and from the multi-chamber systems.

Accordingly, the inventors provide an improved load lock chamber for use with multi-chamber processing systems.

SUMMARY

Dual load lock chambers for use in a multi-chamber processing system are disclosed herein. In some embodiments, a dual load lock chamber includes: a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart by a first predetermined distance; at least one heat transfer device disposed within the first substrate support to heat or cool the first plurality of substrates; and a second load lock chamber disposed adjacent to the first load lock chamber and having a second interior volume and a second substrate support disposed within the second interior volume, wherein the second substrate support includes a second plurality of support surfaces vertically spaced apart to support a corresponding second plurality of substrates, and wherein adjacent ones of the second plurality of support surfaces are spaced apart by a second predetermined distance that less than the first predetermined distance.

In some embodiments, a processing system includes: a factory interface; a substrate transfer chamber; one or more multi-chamber processing systems coupled to the substrate transfer chamber; a dual load lock chamber coupling the factory interface to the substrate transfer chamber; and a vacuum robot disposed in the substrate transfer chamber and configured to transfer substrates between the dual load lock chamber and the one or more multi-chamber processing systems. The dual load lock chamber includes a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart by a first predetermined distance; at least one heat transfer device disposed within the first substrate support to heat or cool the first plurality of substrates; and a second load lock chamber disposed adjacent to the first load lock chamber and having a second interior volume and a second substrate support disposed within the second interior volume, wherein the second substrate support includes a second plurality of support surfaces vertically spaced apart to support a corresponding second plurality of substrates, and wherein adjacent ones of the second plurality of support surfaces are spaced apart by a second predetermined distance that less than the first predetermined distance.

In some embodiments, a dual load lock chamber includes: a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart by a first predetermined distance; a first heat transfer device disposed adjacent a lowermost one of the first plurality of support surfaces to heat or cool one of the first plurality of substrates disposed atop the lowermost one of the first plurality of support surfaces; a second heat transfer device disposed adjacent an uppermost one of the first plurality of support surfaces to heat or cool another one of the first plurality of substrates disposed atop the uppermost one of the first plurality of support surfaces; and a second load lock chamber disposed adjacent to the first load lock chamber and having a second interior volume and a second substrate support disposed within the second interior volume, wherein the second substrate support includes a second plurality of support surfaces vertically spaced apart to support a corresponding second plurality of substrates, and wherein adjacent ones of the second plurality of support surfaces are spaced apart by a second predetermined distance that less than the first predetermined distance.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Dual load-lock chambers for a multi-chamber processing system are disclosed herein. The inventive dual load-lock chamber is configured to allow for two or more substrates to be unloaded from and two or more substrates to be loaded into the dual load-lock chamber in one trip by a multi-substrate transfer robot. As a result, throughput of the multi-chamber processing system is advantageously improved.

Figure 1:
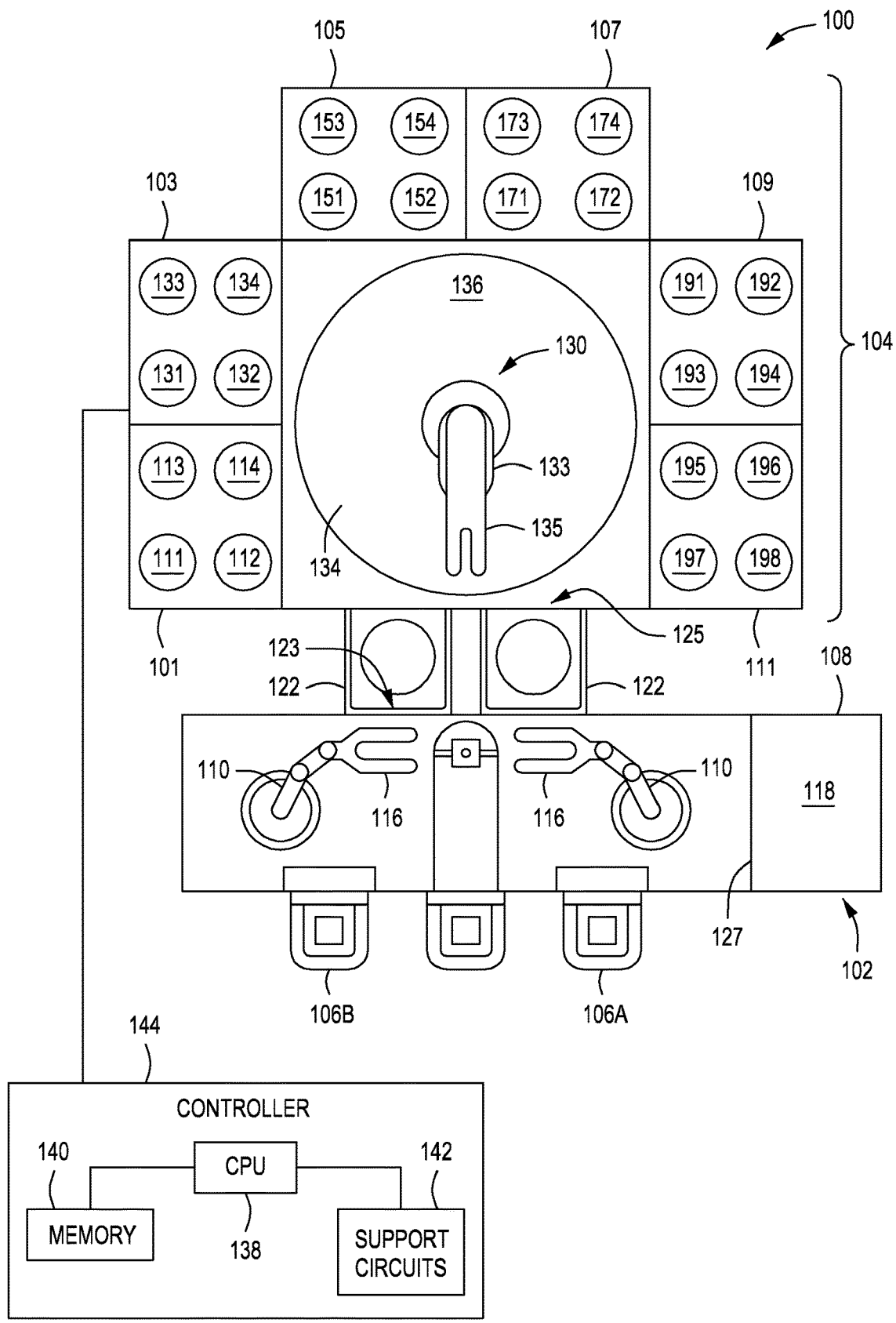
FIG. 1 depicts a schematic top view of a processing system in accordance with some embodiments of the present disclosure.

A multi-chamber processing system disclosed herein may be part of a cluster tool having several multi-chamber processing systems coupled thereto, for example, such as a processing system 100 illustrated in FIG. 1. Referring to FIG. 1, in some embodiments, the processing system 100 may generally comprise a vacuum-tight processing platform 104, a factory interface 102, one or more multi-chamber processing systems 101, 103, 105, 107, 109, 111 and a system controller 144. Non-limiting examples of processing systems that may be suitably modified in accordance with the teachings provided herein include the CENTURA® integrated processing system, one of the PRODUCER® line of processing systems (such as the PRODUCER® GT™), ENDURA™ processing systems, CENTRIS® processing systems, or other suitable processing systems commercially available from Applied Materials, Inc., located in Santa Clara, Calif. Alternatively, multi-chamber processing systems can include two process chambers, such as single-substrate process chambers, disposed adjacent to each other, for example, side by side. Other processing systems (including those from other manufacturers) may also be adapted to benefit from the disclosure.

The processing platform 104 includes one or more multi-chamber processing systems 101, 103, 105, 107, 109, 111 (six shown in FIG. 1). In some embodiments, each multi-chamber processing system includes four process chambers (e.g., 111-114, 131-134, 151-154, 171-174, 191-194, and 195-198). However, each multi-chamber processing system may include fewer or more process chambers (e.g., two, three, five, etc.). The platform further includes at least one dual load-lock chamber 122 (two shown in FIG. 1), shown and discussed in more detail below with respect to FIG. 2, coupled to a substrate transfer chamber 136 at vacuum. The factory interface 102 is coupled to the transfer chamber 136 via the dual load lock chambers 122.

Each multi-chamber processing system 101, 103, 105, 107, 109, 111 includes independent processing volumes that may be isolated from each other. Each multi-chamber processing system 101, 103, 105, 107, 109, 111 may be configured to share resources (e.g., process gas supply, vacuum pump, or the like) between each process chamber of the multi-chamber processing system.

The factory interface 102 may comprise at least one docking station 108 and at least one factory interface robot 110 (two shown in FIG. 1) to facilitate transfer of substrates. The docking station 108 may be configured to accept one or more (two shown in FIG. 1) front opening unified pods (FOUPs) 106A-B. The factory interface robot 110 may comprise a blade 116 disposed on one end of the factory interface robot 110 configured to transfer the substrate from the factory interface 102 to the processing platform 104 for processing through the dual load lock chambers 122. Optionally, one or more metrology stations 118 may be connected to a terminal 127 of the factory interface 102 to facilitate measurement of the substrate from the FOUPs 106A-B.

Each of the dual load lock chambers 122 may include a first side 123 coupled to the factory interface 102 and a second side 125 coupled to the transfer chamber 136. The dual load lock chambers 122 may be coupled to a pressure control system (not shown) which pumps down and vents the dual load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 may have one or more transfer blades 135 coupled to a movable arm 133. For example, in some embodiments, where multi-chamber processing systems are coupled to the transfer chamber 136 as shown, the vacuum robot 130 may have three or more parallel transfer blades 135 configured such that the vacuum robot 130 may simultaneously transfer two substrates between one of the dual load lock chambers 122 and the process chambers of a multi-chamber processing system, for example, process chambers 112, 114 of the multi-chamber processing system 101.

The process chambers (e.g., 111-114, 131-134, 151-154, 171-174, 191-194, and 195-198) of each multi-chamber processing system 101, 103, 105, 107, 109, 111 may be any type of process chamber utilized in substrate processing, for example, such as etch chambers, deposition chambers, or the like. In some embodiments, the process chambers, for example process chambers 112, 114, of each multi-chamber processing system, for example multi-chamber processing system 101, are configured for the same function, for example, etching. For example, in embodiments where each process chamber of a multi-chamber processing system is an etch chamber, each process chamber may include a plasma source, for example, an inductive or capacitively coupled plasma source, a remote plasma source or the like. Further, each process chamber of a multi-chamber processing system may use a halogen-containing gas, for example, provided by a shared gas panel, to etch substrates disposed therein. Examples of halogen-containing gas include hydrogen bromide (HBr), chlorine ($Cl_2$), carbon tetrafluoride ($CF_4$), and the like. For example, after etching the substrates, halogen-containing residues may remain on the substrate surface. The halogen-containing residues may be removed by a thermal treatment process in the load lock chambers 122, or by other suitable means.

Figure 2A:
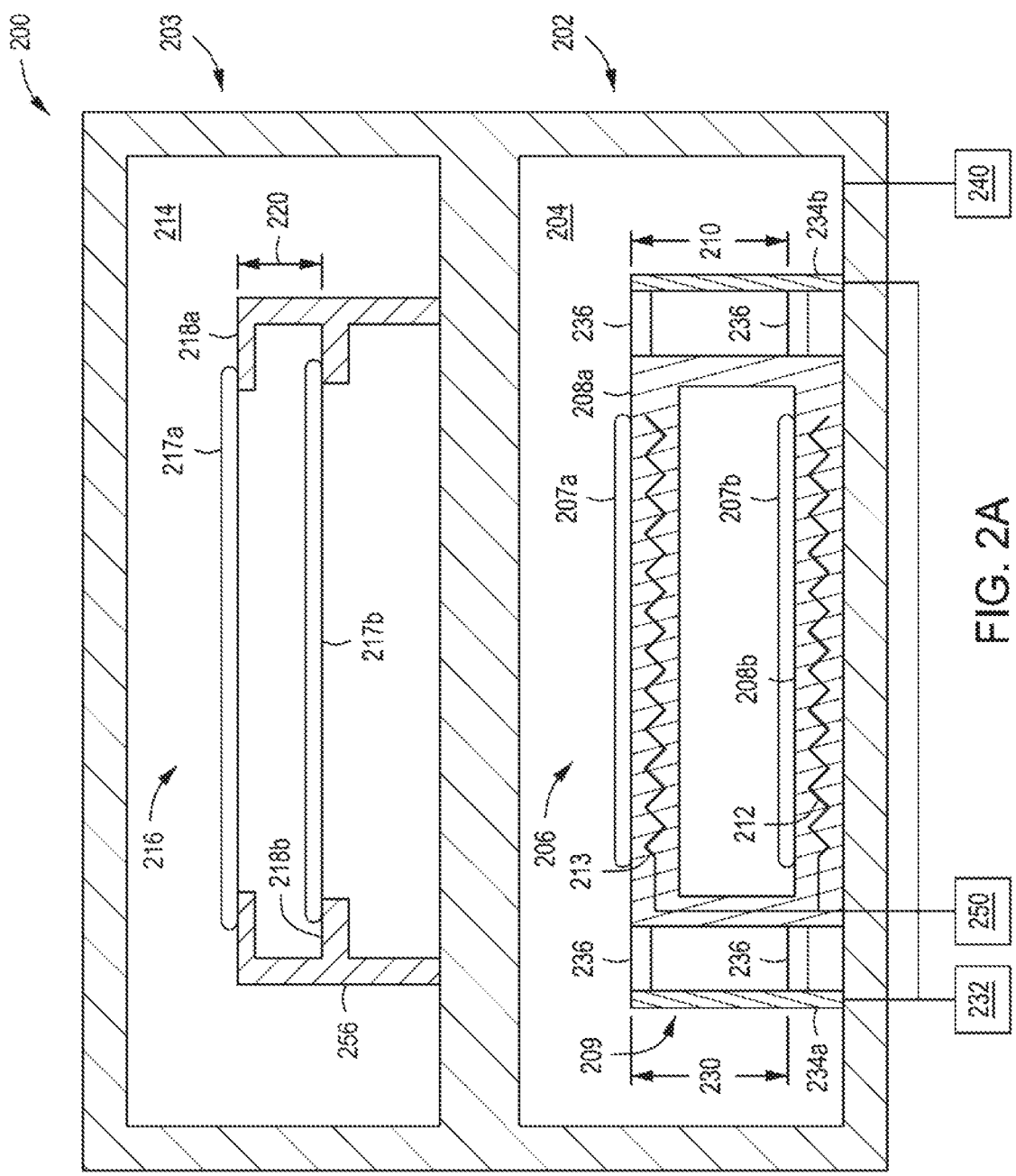
FIGS. 2A-2B depict cross sectional views of dual load-lock chambers in accordance with some embodiments of the present disclosure.
Figure 2B:
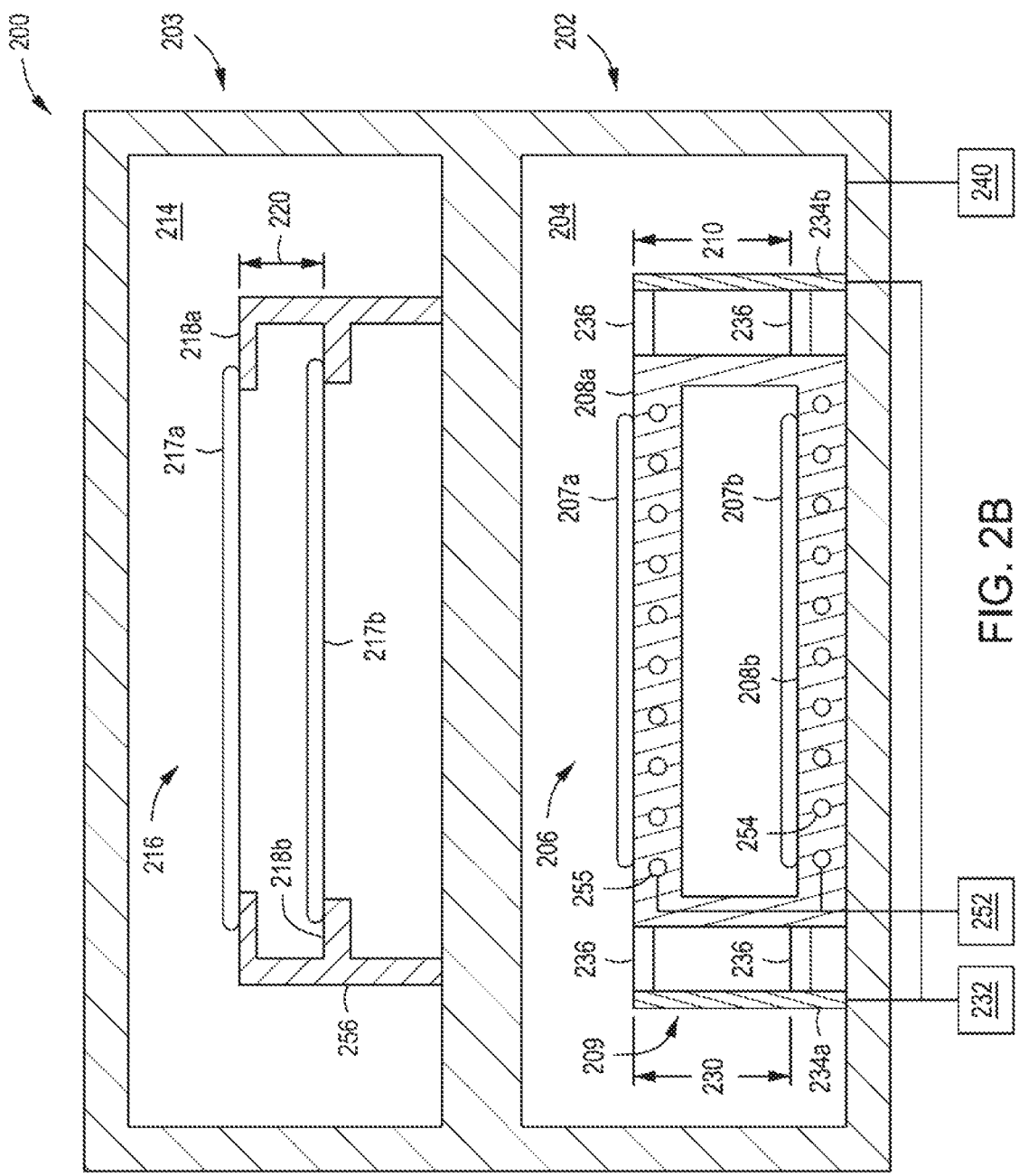

The following description will be made with reference to FIGS. 2A through 2C. FIGS. 2A and 2B depict cross-sectional views of a dual load-lock chamber 200 in accordance with some embodiments of the present disclosure. The dual load-lock chamber 200 may be utilized as the dual load-lock chamber 122 discussed above with respect to FIG. 1. The dual load-lock chamber 200 includes a first load lock chamber 202 and a second load lock chamber 203. The first and second load lock chambers 202, 203 are disposed adjacent to each other. For example, the first and second load lock chambers 202, 203 can be vertically stacked, as depicted in FIG. 2A, or the first and second load lock chambers 202, 203 can be disposed side by side. The first load lock chamber 202 includes a first interior volume 204. In some embodiments, a gas supply 240 may be coupled to the first load lock chamber 202 to supply a gas to the first interior volume 204. In some embodiments, the gas is an inert gas, such as a noble gas.

The first load lock chamber 202 includes a first substrate support 206 disposed within the first interior volume 204. The first substrate support 206 is configured to support a first plurality of substrates 207a, b (e.g., two shown in FIG. 2) on a corresponding first plurality of support surfaces 208a, 208b. Adjacent ones of the first plurality of support surfaces 208a, 208b are vertically spaced apart by a first predetermined distance 210.

The first load lock chamber 202 further includes at least one heat transfer device (e.g., a heater or a chiller) disposed within the first substrate support 206 to heat or cool the first plurality of substrates 207a, b. In some embodiments and as depicted in FIG. 2A, the at least one heat transfer device is a heater 212, for example, a resistive heater or the like. In such embodiments, a heater power supply 250 can be coupled to the heater 212 to control the operation thereof. In some embodiments and as depicted in FIG. 2B, the at least one heat transfer device is a chiller 254, such as a cooling plate, for example including one or more passageways formed through the first substrate support 206 and through which a heat transfer fluid, such as a coolant from a coolant source 252, can be flowed.

In some embodiments, the at least one heat transfer device is disposed adjacent a lowermost one of the first plurality of support surfaces (e.g., support surface 208b). In some embodiments, the first load chamber includes a second heat transfer device disposed adjacent an uppermost one of the first plurality of support surfaces (e.g., support surface 208a). The second heat transfer device is similar to the first heat transfer device. The second heat transfer device can be of the same type as the first heat transfer device. For example, as shown in FIG. 2A, the first heat transfer device is heater 212 (e.g., a first heater) and the second heat transfer device is heater 213 (e.g., a second heater). As shown in FIG. 2B, the first heat transfer device is chiller 254 (e.g., a first chiller) and the second heat transfer device is chiller 255 (e.g., a second chiller).

In some embodiments, the first substrate support 206 is formed of a thermally conductive body (e.g., aluminum) having the at least one heat transfer device (e.g., heater 212 or chiller 254) embedded within the thermally conductive body. In some embodiments, the first substrate support 206 may include a plurality of heat transfer devices corresponding to the plurality of first plurality of support surfaces (e.g., support surfaces 208a, 208b) to heat or cool the substrates disposed atop the first plurality of support surfaces. In some embodiments, the plurality of heat transfer devices may be heaters, such as resistive heating elements (e.g., heaters 212, 213). In some embodiments, the plurality of heat transfer devices may be chillers (e.g., chillers 254, 255).

In some embodiments, in use, the first load lock chamber 202 may be used to remove moisture from the first plurality of substrates 207a,b prior to processing of the substrates in the process chambers. In some embodiments, in use, the first load lock chamber 202 may be used to cool the first plurality of substrates 207a,b subsequent to processing of the substrates in the process chambers.

Figure 2C:
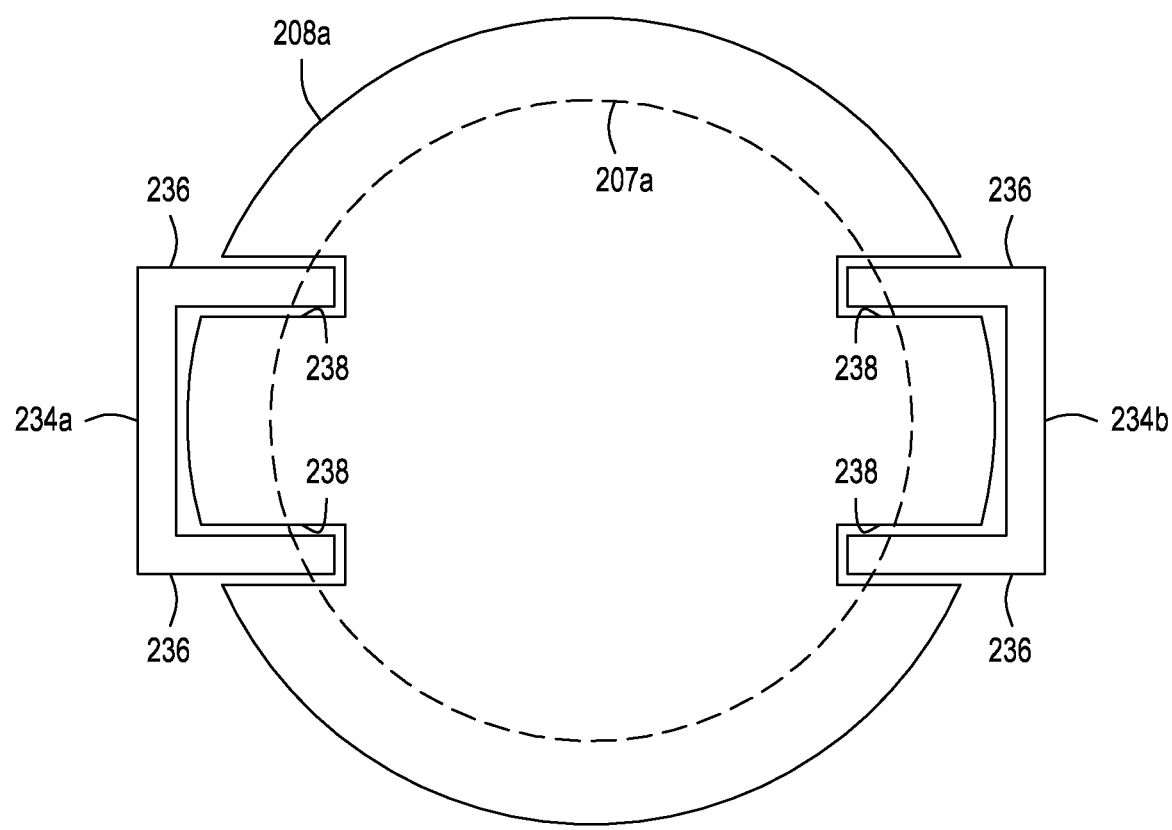
FIG. 2C depicts a top view of a substrate support disposed within a dual load-lock chamber in accordance with some embodiments of the present disclosure.

FIG. 2C depicts a top view of a substrate support in accordance with some embodiments of the present disclosure. In some embodiments, the first load lock chamber 202 further includes a lift assembly 209 configured to lift and lower the first plurality of substrates 207a,b off and onto the first plurality of support surfaces 208a,b as indicated by arrow 230. In some embodiments, the lift assembly 209 includes a motor 232 coupled to two or more lift elements 234. In some embodiments, and as depicted in FIG. 2C, each of the two or more lift elements 234 includes two opposing lift elements 234a,b, each having a pairs of prongs 236 extending into corresponding pairs of grooves 238 formed in corresponding ones of the first plurality of support surfaces 208a,b. The lift elements 234 are raised above the first plurality of support surfaces 208a,b to receive the first plurality of substrates 207a,b. Subsequently, the lift elements 234 are lowered so that the first plurality of substrates 207a,b rest on corresponding ones of the first plurality of support surfaces 208a,b. After the first plurality of substrates 207a,b have been heated to remove moisture from the substrates, the lift elements 234 are raised again so that a robot (e.g., vacuum robot 130) can remove the first plurality of substrates 207a,b from the first load lock chamber 204 and transfer the substrates to a processing chamber.

Returning to FIGS. 2A-2B, in some embodiments, the second load lock chamber 203 is disposed atop the first load lock chamber 202 and includes a second interior volume 214 and a second substrate support 216 disposed within the second interior volume 214. The second substrate support 216 is configured to support a second plurality of substrates 217a,b (e.g., two shown in FIGS. 2A-2B) on a corresponding second plurality of support surfaces 218a,b vertically spaced apart by a second predetermined distance 220. In some embodiments, the second substrate support 216 includes support elements 256 similar to the lift elements 234a,b discussed above. In some exemplary uses, the second load lock chamber 203 may be used to receive the second plurality of substrates 217a,b after processing of the substrates is completed to be loaded onto a FOUP coupled to the docking station 108.

In some embodiments, the first substrate support 206 includes additional elements configured to heat the first plurality of substrates 207a,b, as discussed above, whereas the second substrate support 216 is only configured to hold the second plurality of substrates 217a,b. In such embodiments, the second predetermined distance 220 is less than the first predetermined distance 210 because the second substrate support 216 is less complex than the first substrate support 206. In some embodiments, the second predetermined distance 220 is half of the first predetermined distance 210. In some embodiments, the first predetermined distance is about 28 mm and the second predetermined distance 220 is about 14 mm. In some embodiments, the first and second predetermined distances 210, 220 may correspond to vertical distances between adjacent blades of a substrate transfer robot (e.g., vacuum robot 130).

Figure 3:
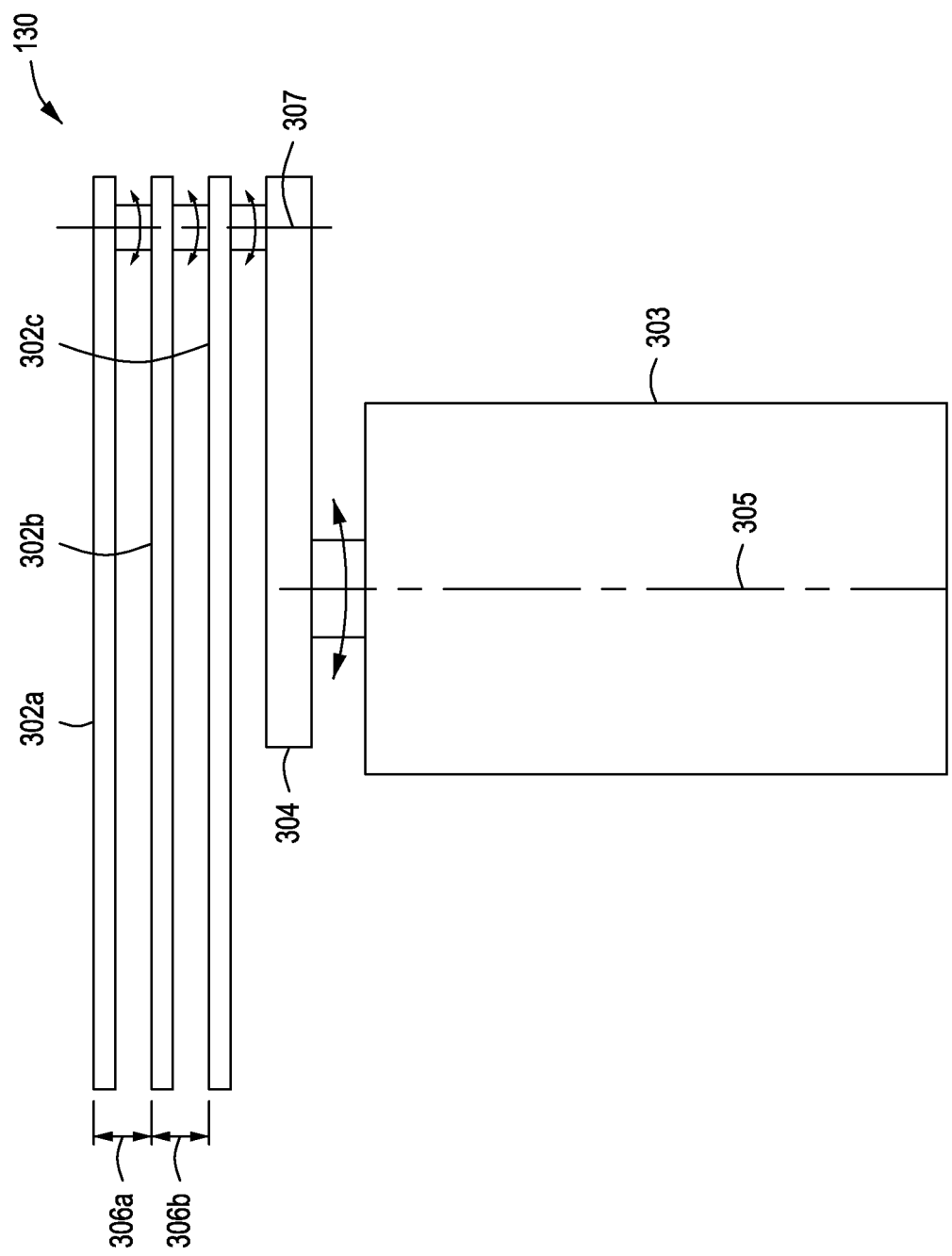
FIG. 3 depicts schematic side view of a multi-substrate transfer robot for use in a processing system in accordance with some embodiments of the present disclosure.

Referring to FIG. 3, a substrate transfer robot (e.g., vacuum robot 130) for transferring substrates between the dual load locks 122 and the processing chamber includes a plurality of blades 302a, 302b, 302c (three shown in FIG. 3) coupled to a motor assembly 303 via a forearm 304. The motor assembly 303 is configured to rotate the forearm 304 about a first axis 305 and to independently rotate the plurality of blades 302a, 302b, 302c about a second axis 307 via pulleys (not shown) disposed within the forearm. A first blade 302a is spaced apart from a second blade 302b by a first vertical distance 306a. The second blade 302b is spaced apart from a third blade by a second vertical distance 306b. In some embodiments, the first and second vertical distances 306a,b are equal. In some embodiments, the first and second vertical distances 306a,b are different.

In some embodiments, the first predetermined distance 210 is equal to the vertical distance between the first blade 302a and the third blade 302c. Such spacing allows for two blades (the first and third blades 302a,c) to be inserted into the first load lock to simultaneously remove two substrates that have, for example, been heated to remove moisture, and transfer the substrates to a multi-chamber processing system (e.g., 101, 103, 105, 107, 109, 111). Because one of the blades (e.g., second blade 302b) is empty, the empty blade can remove a processed substrate from the multi-chamber processing system before the heated substrates are transferred to the processing system. For example, during one trip to the multi-chamber processing system, a processed substrate is removed from the multi-chamber processing system, one of the heated substrates is transferred to the multi-chamber processing system, another processed substrate is removed from the multi-chamber processing system, and the other one of the heated substrates is transferred to the multi-chamber processing system. Because the second blade 302b holds a processed substrate and one of the first or third blades 302a,c holds another processed substrate, the vertical distance between the two processed substrates held by the substrate transfer robot is either 306a or 306b. As such, in some embodiments, the second predetermined distance 220 is equal to the vertical distance between two adjacent blades (306a or 306b). As a result of the number of blades, the vertical spacing between adjacent blades, and the corresponding vertical spacing of the support surfaces of the substrate supports in the dual load locks, the number of trips required to transfer substrates between the dual load locks 122 and one of the multi-chamber processing systems 101, 103, 105, 107, 109, 111 is reduced, thus increasing throughput of the processing system 100.

In addition, the inventive apparatus may be used in a direction opposite to that described above. For example, instead of pre-heating substrates going into the processing system, the apparatus can also be advantageously used to return a plurality of substrates to loadlocks with, for example, chill plates for cooling the substrates exiting the processing system. In such embodiments, the loadlocks can be as described above with respect to FIG. 2A, and may include cooling plates instead of heating plates. In operation, two inbound substrates going into the processing system can be picked up with the three blade robot using two blades close to each other (e.g., an innermost blade and a first outermost blade). Then an outbound substrate can be picked up from a process chamber using the free outermost blade (e.g., the second outermost blade). The inbound substrate on the first outermost blade can be placed in a process chamber. A second finished, outbound substrate can be picked up using the now open first outermost blade. The remaining inbound substrate on the innermost blade can be placed into the process chamber. The two outbound substrate remaining on the two outermost blades can now be placed simultaneously into a loadlock with two cooling plates spaced for the vertical distance between the two outermost blades.

Although the above description has been made with respect to two support surfaces in each load lock chamber (202, 204) and three blades (302a,b,c), any number of support surfaces and blades may exist except that the number of blades should be greater than the number of support surfaces by 1. The additional blade allows for a processed substrate to be removed from the multi-chamber processing system prior to the transfer of the substrates heated in the first load lock 202, thus allowing the robot to make fewer trips between the load locks and the multi-chamber processing systems.

Returning to FIG. 1, the system controller 144 is coupled to the processing system 100. The system controller 144 controls the operation of the processing system 100 using direct control of the process chambers 111-114, 131-134, 151-154, 171-174, 191-194, and 195-198 of the processing system 100 or alternatively, by controlling individual controllers (not shown) associated with the process chambers 111-114, 131-134, 151-154, 171-174, 191-194, and 195-198 and/or each multi-chamber processing system 101, 103, 105, 107, 109, 111 and the processing system 100. In operation, the system controller 144 enables data collection and feedback from the respective chambers and system controller 144 to optimize performance of the processing system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routine, such as a method described below for controlling one or more chamber processes, such as reducing pressure, venting or purging each chamber of a multi-chamber processing system, when executed by the CPU 138, transform the CPU 138 into a specific purpose computer (controller) 144. The software routines may also be stored and/or executed by a second controller (not shown) that is located remotely from the processing system 100.

Thus, methods and apparatus for a multi-chamber processing system having shared vacuum systems have been provided. The inventive multi-chamber processing system advantageously allows a first chamber to be serviced while allowing the remaining chambers to operate normally. Additionally, the inventive multi-chamber processing system advantageously prevents contamination of the remaining process chamber after the first process chamber has been serviced.

While the foregoing is directed to embodiments of the present disclosure, other and further embodiments of the disclosure may be devised without departing from the basic scope thereof.

The invention claimed is:

1. A dual load lock chamber, comprising:
a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart at a fixed first predetermined distance;
at least one heat transfer device disposed within the first substrate support to heat or cool the first plurality of substrates; and
a second load lock chamber disposed adjacent to the first load lock chamber and having a second interior volume and a second substrate support disposed within the second interior volume,
wherein the second substrate support includes a second plurality of support surfaces vertically spaced apart to support a corresponding second plurality of substrates, and
wherein adjacent ones of the second plurality of support surfaces are spaced apart at a fixed second predetermined distance that is less than the first predetermined distance.

2. The dual load lock chamber of claim 1, wherein the second predetermined distance is half of the first predetermined distance.

3. The dual load lock chamber of claim 1, wherein the first plurality of support surfaces is two first support surfaces, and wherein the second plurality of support surfaces is two second support surfaces.

4. The dual load lock chamber of claim 3, wherein the at least one heat transfer device is disposed adjacent a lowermost one of the first plurality of support surfaces.

5. The dual load lock chamber of claim 4, further comprising:
a second heat transfer device disposed adjacent an uppermost one of the first plurality of support surfaces.

6. The dual load lock chamber of claim 1, wherein the first load lock chamber further comprises a lift assembly configured to lift and lower the first plurality of substrates off and onto the first plurality of support surfaces.

7. The dual load lock chamber of claim 1, wherein the at least one heat transfer device is a resistive heating element.

8. The dual load lock chamber of claim 1, wherein the at least one heat transfer device is a cooling plate.

9. The dual load lock chamber of claim 1, further comprising:
a gas supply coupled to the first load lock chamber to supply a gas to the first interior volume.

10. A processing system, comprising:
a factory interface;
a substrate transfer chamber;
one or more multi-chamber processing systems coupled to the substrate transfer chamber;
a dual load lock chamber coupling the factory interface to the substrate transfer chamber, wherein the dual load lock chamber comprises:
a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart at a fixed first predetermined distance;
at least one heat transfer device disposed within the first substrate support to heat or cool the first plurality of substrates; and
a second load lock chamber disposed adjacent to the first load lock chamber and having a second interior volume and a second substrate support disposed within the second interior volume, wherein the second substrate support includes a second plurality of support surfaces vertically spaced apart to support a corresponding second plurality of substrates, and wherein adjacent ones of the second plurality of support surfaces are spaced apart at a fixed second predetermined distance that is less than the first predetermined distance; and
a vacuum robot disposed in the substrate transfer chamber and configured to transfer substrates between the dual load lock chamber and the one or more multi-chamber processing systems.

11. The processing system of claim 10, wherein the vacuum robot includes a plurality of blades each of which is spaced apart from an adjacent blade by a vertical distance.

12. The processing system of claim 11, wherein the second predetermined distance and the vertical distance are substantially equivalent.

13. The processing system of claim 11, wherein the first predetermined distance is about twice as large as the vertical distance.

14. The dual load lock chamber of claim 10, wherein the second predetermined distance is half of the first predetermined distance.

15. The dual load lock chamber of claim 10, wherein the first plurality of support surfaces is two first support surfaces, and wherein the second plurality of support surfaces is two second support surfaces.

16. The dual load lock chamber of claim 15, wherein the at least one heat transfer device is disposed adjacent a lowermost one of the first plurality of support surfaces.

17. The dual load lock chamber of claim 16, further comprising:
a second heat transfer device disposed adjacent an uppermost one of the first plurality of support surfaces.

18. The dual load lock chamber of claim 10, wherein the at least one heat transfer device is either a resistive heating element or a cooling plate.

19. The dual load lock chamber of claim 10, wherein the first load lock chamber further comprises a lift assembly configured to lift and lower the first plurality of substrates off and onto the first plurality of support surfaces.

20. A dual load lock chamber, comprising:
a first load lock chamber having a first interior volume and a first substrate support disposed within the first interior volume, wherein the first substrate support includes a first plurality of support surfaces vertically spaced apart to support a corresponding first plurality of substrates, and wherein adjacent ones of the first plurality of support surfaces are spaced apart at a fixed first predetermined distance;
a first heat transfer device disposed within a lowermost one of the first plurality of support surfaces to heat or cool one of the first plurality of substrates disposed atop the lowermost one of the first plurality of support surfaces;
a second heat transfer device disposed adjacent to an uppermost one of the first plurality of support surfaces to heat or cool another one of the first plurality of substrates disposed atop the uppermost one of the first plurality of support surfaces;
a second load lock chamber disposed adjacent to the first load lock chamber and having a second interior volume and a second substrate support disposed within the second interior volume, wherein the second substrate support includes a second plurality of support surfaces vertically spaced apart to support a corresponding second plurality of substrates, wherein adjacent ones of the second plurality of support surfaces are spaced apart at a fixed second predetermined distance that less than the first predetermined distance.

* * * * *